United States Patent
Sakai et al.

(10) Patent No.: US 6,437,373 B1
(45) Date of Patent: Aug. 20, 2002

(54) ORGANIC ELECTROLUMINESCENCE LAYER WITH OLIGOMER HOLE INJECTION LAYER

(75) Inventors: Toshio Sakai; Chishio Hosokawa; Hisayuki Kawamura, all of Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/446,905

(22) PCT Filed: May 7, 1999

(86) PCT No.: PCT/JP99/02377

§ 371 (c)(1),
(2), (4) Date: Mar. 24, 2000

(87) PCT Pub. No.: WO99/59382

PCT Pub. Date: Nov. 18, 1999

(30) Foreign Application Priority Data

May 8, 1998 (JP) ............................................. 10-125819

(51) Int. Cl.$^7$ .......................... H05B 33/04; H01L 33/00
(52) U.S. Cl. ....................... 257/103; 428/690; 313/501; 257/40
(58) Field of Search ................... 257/103, 40; 428/690; 313/501–506

(56) References Cited

U.S. PATENT DOCUMENTS

| | | | |
|---|---|---|---|
| 5,374,489 A | * | 12/1994 | Imai et al. |
| 5,508,136 A | * | 4/1996 | Shirota et al. |
| 5,652,067 A | * | 7/1997 | Ito et al. ..................... 428/690 |
| 5,939,149 A | * | 8/1999 | Jang et al. ................... 427/535 |
| 6,150,143 A | * | 11/2000 | Thompson et al. ......... 428/690 |

FOREIGN PATENT DOCUMENTS

EP    0 779 765 A2 *  6/1997
GB    2319660   A *  5/1998

OTHER PUBLICATIONS

Patent Abstracts of Japan, Publication No. 08291115 A, dated Nov. 5, 1996.*
U.S. application No. 09/446,905, filed Mar. 24, 2000, pending.
U.S. application No. 09/530,597, filed May 9, 2000, pending.
U.S. application No. 08/941,036, filed Sep. 30, 1997, pending.
U.S. application No. 09/039,256, Mar. 16, 1998, pending.
U.S. application No. 09/446,905, filed Jan. 3, 2000, pending.
U.S. application No. 09/485,698, filed Feb. 28, 2000, pending.

* cited by examiner

Primary Examiner—Minh Loan Tran
Assistant Examiner—Thomas L Dickey
(74) Attorney, Agent, or Firm—Oblon, Spivak, McClelland, Maier & Neustadt, P.C.

(57) ABSTRACT

The present invention is to provide an organic EL element which can secure the durability by which to endure the pulse driving and which has an excellent heat resistance. In an organic electroluminescence element in which a luminous layer and a hole injection layer are formed between an anode and a cathode, the hole injection layer is formed using an oligomer having a phenylenediamine structure and having a glass transition temperature of 110° C. or more, and an intermediate layer is formed between the hole injection layer and the anode to inhibit a chemical reaction in an interface between the anode and the hole injection layer. Consequently, it is possible to remarkably improve the heat resistance of the element, to secure the excellent durability capable of enduring severe driving conditions, and to realize the prolongation of life of the element.

5 Claims, 1 Drawing Sheet

ORGANIC ELECTROLUMINESCENCE LAYER WITH OLIGOMER HOLE INJECTION LAYER

This application is a 371 of PCT/JP99/02377, filed May 7, 1999.

TECHNICAL FIELD

The present invention relates to an organic electroluminescence element in which at least a hole injection layer and a luminous layer are interposed between a pair of electrodes.

BACKGROUND OF THE INVENTION

Since an electroluminescence element (hereinafter referred to as an "EL element") using electroluminescence causes self-luminescence, the visibility is high and the element is a completely solid state element so that it has an excellent impact strength. Accordingly, its use as a luminescence element in various display devices has attracted much interest.

This EL element includes an inorganic EL element obtained by using an inorganic compound as a luminous material and an organic EL element obtained by using an organic compound as a luminous material. Especially in the organic EL element of these, the driving voltage is quite low as compared with the inorganic EL element, and the element can further easily be downsized. Accordingly, studies and developments to put the same to practical use have been increasingly conducted.

In order to put the organic EL element to practical use, the increase in efficiency of the element performance and the improvement in the driving life are indispensable. For solving these problems, the improvements in the luminous material and the construction of the element have been carried out.

As the organic EL element, known is an element based on a laminated-type element construction of anode/organic luminous layer/cathode and provided on this with a hole injection transfer layer or an electron injection transfer layer as required, for example, an element having the construction of anode/hole injection transfer layer/organic luminous layer/cathode or the construction of anode/hole injection transfer layer/organic luminous layer/electron injection transfer layer/cathode, or the like is known.

The hole injection transfer layer here has a function of injecting holes from an anode at good efficiency and transferring the holes to the luminous layer, and it is, in many cases, constructed of a hole injection layer and a hole transfer layer.

Further, the electron injection transfer layer has a function of injecting electrons from a cathode at good efficiency and transferring the electrons to the luminous layer.

The luminous layer has a function of conducting luminescence by recombination of holes and electrons injected.

As the anode of the organic EL element, a transparent electrode formed of an ITO (Indium Tin Oxide) film is generally used. In this case, in order to inject holes from ITO at good efficiency by reducing an energy barrier in the hole injection, an amine-type material of which the ionization potential is close to that of ITO to give a great degree of hole transfer is often used in the hole injection layer.

By the way, since the organic EL element has quite a low thickness of approximately 100 nm, the surface form of ITO greatly influences the performance of the element. Specifically, when a protrusion or the like is present on the surface of ITO, the crystallization of the organic thin film proceeds with this protrusion as a base point, and it causes increase in a leak current or formation of a non-luminous point called a dark spot. For this reason, a high amorphousness and good film properties are required for the hole injection layer formed on ITO.

Further, when the organic EL element is driven through constant current driving, the driving voltage is increased with time to decrease a luminance. Such a deterioration phenomenon is considered to occur because a chemical reaction such as an oxidation reaction or the like is caused in an interface between ITO and the hole injection layer which is directly contacted with this ITO to proceed with the deterioration through the driving.

In order to solve such a problem, an organic EL element in which a hole injection transfer zone is constructed of a layer containing a hole-injecting porphyrin compound and a hole-transferring aromatic tertiary amine is disclosed (U.S. Pat. No. 2,597,377).

Further, it has been known that a CuPc (copper phthalocyanine) thin film is formed on the surface of ITO whereby a driving stability can be increased to reduce the increase in the driving voltage (S. A. Van Slyke et al., Appl. Phys. Lett., 69, 2160 (1996)).

Japanese Patent Laid-Open No. 314594/1994 discloses a structure in which a CuPc film is formed on ITO and a hole injection layer formed of a TPD-based oligomer, a triarylamine derivative is laminated on this CuPc film.

Although the driving stability is improved by these methods, there was a problem that a driving life (durability) cannot be improved satisfactorily.

Further, when pulse driving such as simple matrix driving is employed as a driving system in applying an organic EL element to a dot matrix display or the like, a current density has to be increased for conducting luminescence instantaneously at high luminance. Accordingly, there arises a need to pass a great current by periodically applying a high voltage. As a result, an element comes to be driven under severer conditions than in case of ordinary DC (direct current) driving. Therefore, the pulse driving involved a problem that a chemical reaction in an interface between ITO and a hole injection layer tends to proceed to give a short life.

Further, in order to put a luminescence element to practical use, a stability at a high temperature is required. However, when an ordinary organic EL element is stored at a high temperature, there are problems that the efficiency tends to decrease, further luminescence becomes uniform and the like. Thus, it was difficult to put the same to practical use.

It is an object of the present invention to provide an organic EL element in which a durability by which to endure the pulse driving can be secured and the heat resistance is excellent.

DISCLOSURE OF THE INVENTION

The present inventors have assiduously conducted investigations, and have consequently obtained findings that an intermediate layer is interposed between a hole injection layer and an anode and a material to meet predetermined conditions is used in the hole injection layer, making it possible to realize the prolongation of life and the improvement in the heat resistance. The present invention has been completed on the basis of these findings.

That is, the gist of the present invention is as follows.

1. An organic electroluminescence element comprising an anode and a cathode which are opposite to each other, and a hole injection layer and a luminous layer which are interposed between these anode and cathode, characterized in that the hole injection layer contains an oligomer having a phenylenediamine structure and having a glass transition temperature of 110° C. or more, and an intermediate layer for inhibiting a reaction in an interface between the hole injection layer and the anode is formed between the hole injection layer and the anode.

2. The organic electroluminescence element as recited in the above 1, wherein an ionization potential of the intermediate layer is larger than a work function of the anode and smaller than an ionization potential of the oligomer of the hole injection layer.

3. The organic electroluminescence element as recited in the above 1, wherein the intermediate layer is formed of an inorganic semiconductor.

4. The organic electroluminescence element as recited in the above 2, wherein the intermediate layer is formed of an inorganic semiconductor.

5. The organic electroluminescence element as recited in the above 1 or 2, wherein the intermediate layer is formed of an inorganic insulator.

6. The organic electroluminescence element as recited in the above 1 or 2, wherein the intermediate layer is formed of a phthalocyanine-based compound.

7. The organic electroluminescence element as recited in the above 1 or 2, wherein the intermediate layer is formed of a carbon film.

The present invention is an organic electroluminescence element comprising an anode and a cathode which are opposite to each other, and a hole injection layer and a luminous layer which are interposed between these anode and cathode, characterized in that the hole injection layer contains an oligomer having a phenylenediamine structure and having a glass transition temperature of 110° C. or more, and an intermediate layer for inhibiting a reaction in an interface between the hole injection layer and the anode is formed between the hole injection layer and the anode.

The hole injection layer here is a layer which is formed between the anode and the luminous layer for improving the injection property of the hole.

Further, the phenylenediamine structure here is a structure that two amines are arranged through a phenyl group.

Examples of the material having this structure include, for example, a compound represented by general formula (I)

(wherein n is an integer of 1 to 3, $Ar^1$ to $Ar^7$ each represent a carbocyclic group having 6 to 30 carbon atoms, and either $Ar^2$ or $Ar^5$ is a phenylene group), a compound represented by general formula (II)

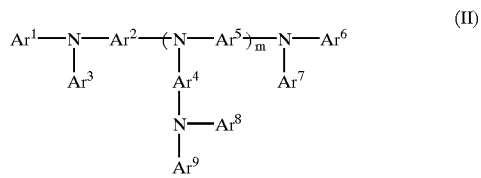

(wherein m is an integer of 1 to 3, $Ar^1$ to $Ar^9$ each represent a carbocyclic group having 6 to 30 carbon atoms, and at least one of $Ar^2$, $Ar^4$ and $Ar^5$ is a phenylene group), and the like.

In the present invention, among the oligomers having such a phenylenediamine structure, one having a glass transition temperature of 110° C. or more is used as the material for the hole injection layer, so that the heat resistance of the element can markedly be improved and the excellent luminous efficiency is obtained.

And, the intermediate layer is formed between the hole injection layer containing such an oligomer and the anode, whereby the hole injection layer and the anode can be spaced apart, making it possible to eliminate the chemical reaction in the interface between the hole injection layer and the anode. Consequently, the excellent durability by which to endure the severe driving conditions in the pulse driving or the like can be secured, and the prolongation of life of the element can be achieved.

The hole injection layer may be interposed between the anode and the luminous layer along with the hole transfer layer, and may have a function as a hole injection layer that improves both the injection property and the transferability of the hole.

The above-described oligomer may be a linear oligomer or a branched oligomer.

In this case, it is desirable that the ionization potential of the intermediate layer is larger than a work function of the anode and smaller than the ionization potential of the oligomer of the hole injection layer.

When the ionization potential of the intermediate layer is thus defined, the hole injection barrier can surely be decreased, making it possible to decrease the driving voltage and to improve the durability.

The material constituting the intermediate layer may be either an organic material or an inorganic material. For example, the intermediate layer can be formed of an inorganic semiconductor or an inorganic insulator. Examples of the inorganic semiconductor include, for example, GaAlN, GaInN, GaN, $Si_{x-1}$—$C_x$ (0<x<1), Si, CuI, ZnTe, ZnS, CdS, CdTe, $CdSe_xS_{1-x}$(0<x<1), Te and Se. Examples of the inorganic insulator include $SiO_x$ (0<x<2), LiF, $Li_2O$, $Al_2O_3$, $TiO_2$, $BaF_2$, $CaF_2$, $MgF_2$ and the like.

In case the organic material is used as the material of the intermediate layer, the intermediate layer can be formed of a phthalocyanine-type compound, a quinacridone-type compound or the like.

Further, the intermediate layer can also be formed of a carbon film, and it can specifically be formed of p-type diamond, a diamond-like carbon film ($SP^3$ ingredient-containing carbon film) or the like.

BRIEF DESCRIPTION OF THE DRAWINGS

In FIG. 1, numeral 10 is a transparent substrate, numeral 11 an anode, numeral 12 a cathode, numeral 13 a luminous layer, numeral 14 a hole injection layer, and numeral 15 an intermediate layer.

BEST MODE FOR CARRYING OUT THE INVENTION

Figure 1:
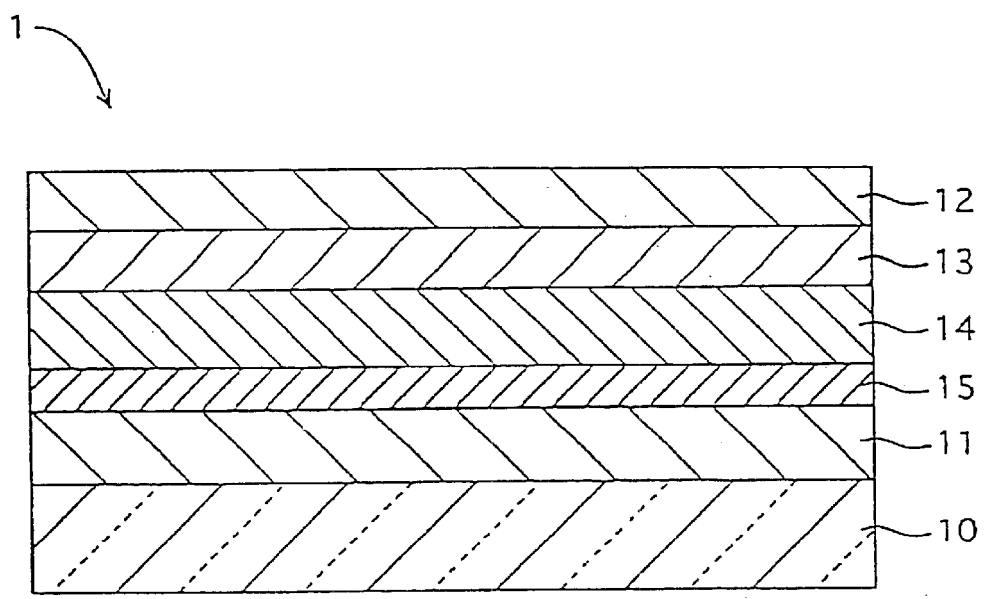
FIG. 1 is a view showing one embodiment of the organic electroluminescence element in the present invention.

A mode for carrying out the present invention is described below by referring to the drawings.

FIG. 1 shows an organic EL element 1 of the present mode.

The organic EL element 1 of the present mode has an element structure in which the transparent substrate 10 is used as a support and the luminous layer 13 and the hole injection layer 14 formed of the organic material are interposed between the pair of the electrodes 11, 12 opposite to each other, and the transparent substrate 10 is used as a light draw-out surface.

Of the pair of the electrodes 11, 12, the anode 11 is made of a transparent electrode such as an ITO thin film or the like, and formed on the transparent substrate 10 made of a glass or the like.

The hole injection layer 14, the luminous layer 13 and the cathode 12 are laminated on this anode 11 in this order, and the intermediate layer 15 is interposed between the hole injection layer 14 and the anode 11.

The hole injection layer 14 is constructed by containing the straight chain oligomer or the branched chain oligomer having the phenylenediamine structure and having a glass transition temperature of 110° C. or more.

The intermediate layer 15 is a layer for inhibiting the reaction in the interface between the hole injection layer 14 and the anode 11, and it is formed of the material of which the ionization potential is larger than the work function of the anode 11 and smaller than the ionization potential of the oligomer of the hole injection layer 14.

Such an intermediate layer 15 is formed of any of the inorganic semiconductor, the phthalocyanine-based compound and the carbon film.

The layer construction of the organic EL element in the present invention may be one containing the luminous layer and the hole injection layer, and it is not particularly limited. For example, it can be applied to organic EL elements having various layer constructions, for example, anode/intermediate layer/hole injection layer/organic luminous layer/electron injection transfer layer/cathode, anode/intermediate layer/hole injection layer/hole transfer layer/organic luminous layer/electron injection transfer layer/cathode, and the like.

Next, the effects of the present invention are described on the basis of specific Examples.

EXAMPLES 1

In this Example 1, an organic EL element was obtained by employing the following specific element construction in the above-described mode.

Incidentally, the following layers (2) to (5) were formed by vacuum deposition.

(1) Construction of an element 1) anode: ITO 2) intermediate layer: CuPc(copper phthalocyanine)

3) hole injection layer: laminated film of TPD 87 and TPD 78

4) luminous layer: Alq (tris(8-quinolinol) aluminum)

5) cathode: Composite film of Al and Li

The structural formulas of TPD 87 and TPD 78 are as follows.

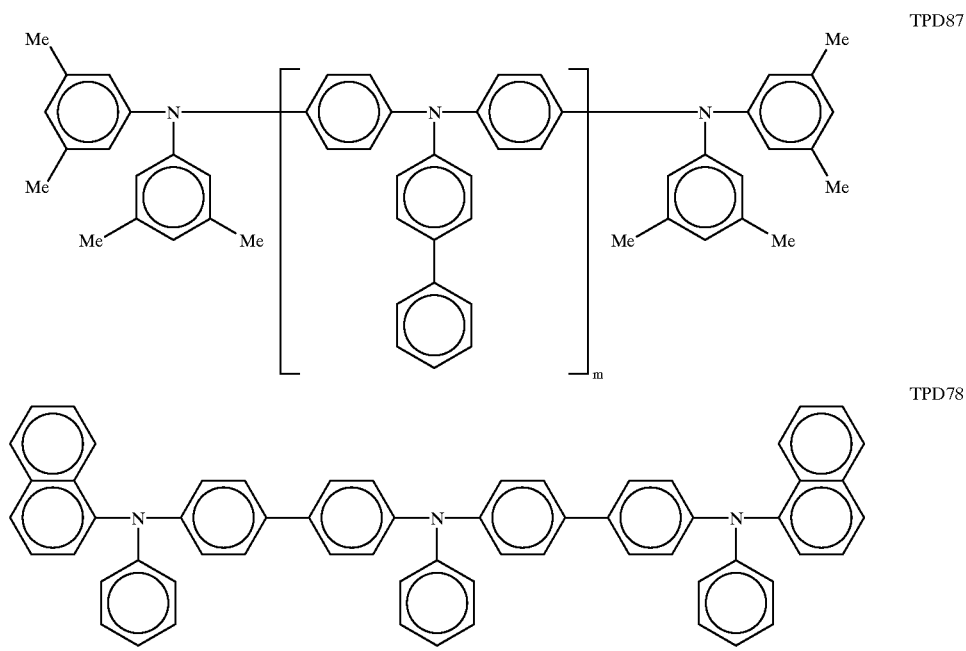

TPD87

TPD78

EXAMPLE 2

An organic EL element of this Example 2 was produced as in Example 1 using the same construction of the element as in Example 1 except that the intermediate layer was formed of a carbon film.

EXAMPLE 3

An organic EL element of this Example 3 was produced as in Example 1 using the same construction of the element as in Example 1 except that the intermediate layer was formed of an SiO₂ film. However, the SiO₂ film was formed by a sputtering method.

Comparative Example 1

An organic EL element of this Comparative Example 1 was obtained as in Example 1 employing the same construction of the element as in Example 1 except that the intermediate layer was omitted.

Comparative Example 2

An organic EL element of this Comparative Example 2 was obtained as in Example 1 using the same construction of the element as in Example 1 except that the hole injection layer was a laminated film of TPD 74 and TPD 78.

The structural formula of TPD 74 is as shown below.

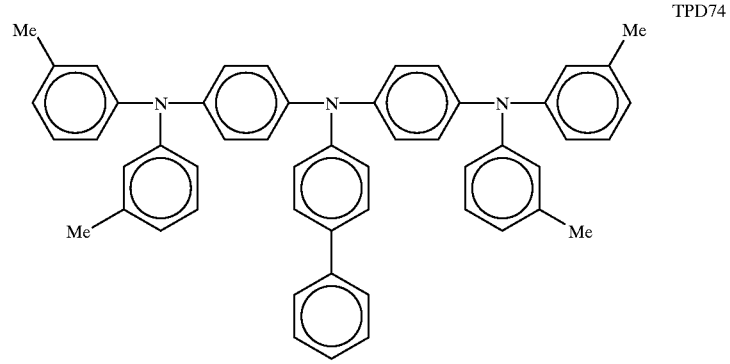

TPD74

Comparative Example 3

An organic EL element of this Comparative Example 3 was obtained as in Example 1 employing the same construction of the element as in Example 1 except that the intermediate layer was omitted and the hole injection layer was a laminated film of TPD 1 and TPD 2.

The structural formulas of TPD 1 and TPD 2 are as shown below.

Comparative Example 4

An organic EL element of this Comparative Example 3 was obtained as in Example 1 using the same construction of the element as in Example 1 except that the hole injection layer was a laminated film of TPD 1 and TPD 2.

Incidentally, a work function of ITO is 5.1 eV, and ionization potentials of the materials for the intermediate layer and the hole injection layer used in Examples 1 and 2 and Comparative Examples 1 to 4 are as shown in Table 1.

TABLE 1

|  | Material | Ionization potential (eV) |
|---|---|---|
| Hole injection layer | TPD 87 | 5.2 |
|  | TPD 78 | 5.5 |
|  | TPD 74 | 5.2 |

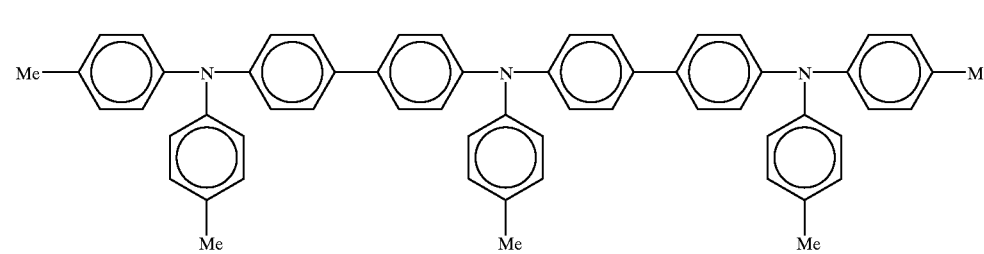

TPD1

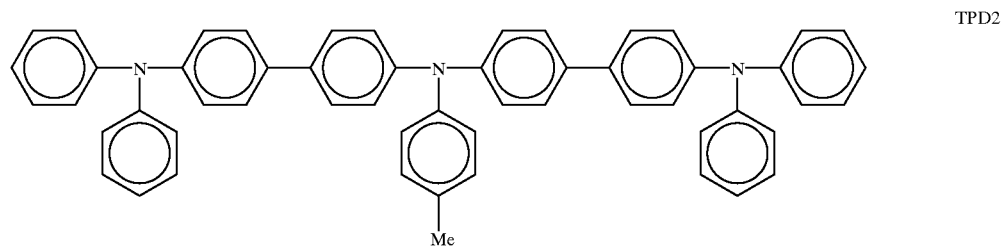

TPD2

TABLE 1-continued

|  | Material | Ionization potential (eV) |
|---|---|---|
| Intermediate layer | TPD 1 | 5.4 |
|  | TPD 2 | 5.5 |
|  | CuPc | 5.2 |
|  | C | 5.2 |

Evaluation of an Organic EL Element

With respect to the organic EL elements of Examples 1 to 3 and Comparative Examples 1 to 4, the durability and the heat resistance were measured respectively.

The measurement of the durability was conducted by driving each of the organic EL elements with the initial luminance of 300 cd/m$^2$ and measuring the half-life. At this time, the driving conditions are a duty of $1/100$ and a driving frequency of 60 Hz. The results are shown in Table 2.

Incidentally, in Table 2, the life of each element was shown in terms of a ratio given when the half-life in Comparative Example 1 was defined as 1.

The measurement of the heat resistance was conducted by storing each of the organic EL elements at 85° C. for 500 hours and examining the change in the luminous efficiency before and after the storage. The results are shown in Table 2. In Table 2, o indicated that the luminous efficiency was not decreased, and x indicated that the luminous efficiency was decreased.

TABLE 2

| | Intermediate layer | Hole injection layer | Tg (° C.)* | Life | Heat resistance |
|---|---|---|---|---|---|
| Example 1 | CuPc | TPD 87/TPD 78 | 112/126 | 5 | o |
| Example 2 | C | TPD 87/TPD 78 | 112/126 | 4.5 | o |
| Example 3 | SiO$_2$ | TPD 87/TPD 78 | 112/126 | 5 | o |
| Comaparative Example 1 | — | TPD 87/TPD 78 | 112/126 | 1 | o |
| Comparative Example 2 | CuPc | TPD 74/TPD 78 | 80/126 | 3 | x |
| Comparative Example 3 | — | TPD 1/TPD 2 | 120/115 | 1 | o |
| Comparative Example 4 | CuPc | TPD 1/TPD 2 | 120/115 | 2.1 | o |

*Tg(° C) indicates a glass transition temperature of each material constituting a hole injection layer.

From Table 2, it is found that since the intermediate layer formed of CuPc is provided in Example 1, the pulse life is prolonged more than in Comparative Example 1 in which the intermediate layer is absent.

From Example 2 or 3, it is found that when the intermediate layer is a carbon film or SiO$_2$, the effect of improving the pulse life is obtained.

On the other hand, in Comparative Example 2, it is found that since the hole injection layer is formed of TPD 74 having the low glass transition temperature (Tg), the heat resistance is poor.

Comparative Example 3 is a case in which the hole injection layer is formed of TPD 1 and TPD 2 both having no phenylenediamine structure. It has the same life as Comparative Example 1.

In Comparative Example 4, the intermediate layer is formed on the element of Comparative Example 3. However, it is found that since the material of the hole injection layer has no phenylenediamine structure, the pulse life is increased to a small extent in spite of the formation of the intermediate layer.

Industrial Applicability

As stated above, according to the present invention, the heat resistance and the luminous efficiency can be improved by forming the hole injection layer using the oligomer having the phenylenediamine structure and having the glass transition temperature of 110° C. or more.

Further, the intermediate layer is formed between the hole injection layer containing such an oligomer and the anode, whereby the excellent durability by which to endure severe driving conditions of the pulse driving or the like can be secured and the prolongation of life of the element can be achieved.

What is claimed is:

1. An organic electroluminescence element comprising an anode and a cathode which are opposite to each other, and a hole injection layer and a luminous layer which are interposed between the anode and the cathode, wherein the bole injection layer has a glass transition temperature of 110° C. or more and comprises an oligomer having a phenylenediamine structure, wherein an intermediate layer for inhibiting a reaction in an interface between the hole injection layer and the anode is formed between the hole injection layer and the anode, and wherein an ionization potential of said intermediate layer is larger than a work function of said anode and smaller than an ionization potential of the oligomer of said hole injection layer.

2. The organic electroluminescence element as claimed in claim 1, wherein said intermediate layer is formed of an inorganic semiconductor.

3. The organic electroluminescence element as claimed in claim 1, wherein said intermediate layer is formed of an inorganic insulator.

4. The organic electroluminescence element as claimed in claim 1 wherein said intermediate layer is formed of a phthalocyanine-based compound.

5. The organic electroluminescence element as claimed in claim 1, wherein said intermediate layer is formed of a carbon film.

* * * * *

UNITED STATES PATENT AND TRADEMARK OFFICE
CERTIFICATE OF CORRECTION

PATENT NO. : 6,437,373 B1
DATED : August 20, 2002
INVENTOR(S) : Sakai et al.

It is certified that error appears in the above-identified patent and that said Letters Patent is hereby corrected as shown below:

Title page, Item [54] and Column 1, lines 1-3,
The Title is incorrect. The title should read:

-- [54] ORGANIC ELECTROLUMINESCENT LAYER WITH OLIGOMER HOLE INJECTION LAYER --

Title page,
Item [86], the filing date is incorrect. Item [86] should read:

-- [86] PCT No.: PCT/JP99/02377

§ 371 (c)(1),
(2), (4) Date: Feb. 14, 2000 --

Signed and Sealed this

Twenty-fourth Day of December, 2002

JAMES E. ROGAN
*Director of the United States Patent and Trademark Office*